United States Patent
Ze

(10) Patent No.: US 8,482,335 B2
(45) Date of Patent: Jul. 9, 2013

(54) HIGH LINEARITY UP-CONVERSION MIXER

(75) Inventor: Dedong Ze, Shanghai (CN)

(73) Assignee: Omnivision Technologies (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/595,778

(22) Filed: Aug. 27, 2012

(65) Prior Publication Data

US 2013/0057317 A1 Mar. 7, 2013

(30) Foreign Application Priority Data

Sep. 7, 2011 (CN) .......................... 2011 1 0264420

(51) Int. Cl.
  *H03M 11/00* (2006.01)
  *G06G 7/25* (2006.01)
(52) U.S. Cl.
  USPC ............................ 327/355; 327/103; 455/323
(58) Field of Classification Search
  USPC ................... 327/355–361, 103; 455/323, 326
  See application file for complete search history.

(56) References Cited

U.S. PATENT DOCUMENTS 7,877,065 B2 *   1/2011   Morohashi ..................... 455/118
2006/0261875 A1 * 11/2006   Breems et al. ................. 327/359

* cited by examiner

*Primary Examiner* — Dinh T. Le
(74) *Attorney, Agent, or Firm* — Blakely Sokoloff Taylor & Zafman

(57) ABSTRACT

A high linearity up-conversion mixer is disclosed, which includes a voltage-to-current conversion circuit and an up-conversion mixer core circuit, the voltage-to-current conversion circuit has a differential signal positive input end for receiving an I/Q-channel positive baseband voltage signal and a differential signal negative input end for receiving an I/Q-channel negative baseband voltage signal, wherein the received positive and negative baseband voltage signals are low pass filtered by the voltage-to-current conversion circuit and are respectively converted to a first and a second current signal; the first and the second current signals are inputted to the up-conversion mixer core circuit to mix with local oscillator signals so as to output high linearity frequency-mixed signals. By embedding low-pass filters into the voltage-to-current conversion circuit of the up-conversion mixer, the present invention can ensure the high linearity of the up-conversion mixer while reduce the chip area and the current.

3 Claims, 2 Drawing Sheets

HIGH LINEARITY UP-CONVERSION MIXER

CROSS-REFERENCE TO RELATED APPLICATIONS

This application claims the priority of Chinese patent application number 201110264420.7, filed on Sep. 7, 2011, the entire contents of which are incorporated herein by reference.

TECHNICAL FIELD

The present invention relates to a high linearity up-conversion mixer, and more particularly, to a high linearity up-conversion mixer with an embedded baseband filter.

BACKGROUND

Superheterodyne transmitters, zero IF (Intermediate Frequency) transmitters and DIF (Digital Intermediate Frequency) transmitters are the most commonly used transmitters. Superheterodyne transmitters are capable of realizing two times of up-conversion by using analog devices, and the greatest advantage of superheterodyne transmitters is excellent selectivity, namely, the ability to process and select small signals in the presence of strong interference signals. Superheterodyne transmitters have been widely used in various wireless communications systems due to its sophisticated design and continuously improving performance and integration.

A zero IF transmitter is an improvement of the superheterodyne transmitter based on the zero IF technology. A zero IF transmitter has the same analog IF module with a superheterodyne transmitter, but a zero IF transmitter omits the process of analog IF and directly performs up-conversion, so that the architecture is simplified. FIG. 1 is a schematic diagram of the structure of a zero IF transmitter in the prior art. As shown in FIG. 1, the zero IF transmitter is comprised of two orthogonal digital-to-analog converters, two orthogonal baseband filters, a single sideband up-conversion mixer and a power amplifier. The operation principle of the zero IF transmitter is as follows: digital baseband IQ signals (I_DAC<N: 1> and Q_DAC<N: 1>) are converted to analog IQ signals by the digital-to-analog converters; the analog IQ signals are passed through the baseband filters and then are mixed with two orthogonal local oscillator signals (LO_Q and LO_I) and are finally added together, so that the analog IQ signals are converted to analog RF modulated signals and are outputted (TX_OUT) via the power amplifier. As shown in FIG. 2, the up-conversion mixer is comprised of a high linearity voltage-to-current conversion circuit and an up-conversion mixer core circuit, wherein the high linearity voltage-to-current conversion circuit is used for converting the baseband signals that have passed through the baseband filters (BB_INP and BB_INN) to current signals; the up-conversion mixer core circuit is used for mixing the current signals outputted by the high linearity voltage-to-current conversion circuit with the LO signals so as to output high linearity frequency-mixed signals (MIX_OP and MIX_ON).

Nevertheless, the baseband filter and the up-conversion mixer are both employed in the transmitter of such structure, which has the disadvantages of occupying a large chip area and generating a high current, therefore, an improved technical solution is needed to solve this problem.

SUMMARY OF THE INVENTION

An objective of the present invention is to provide a high linearity up-conversion mixer which integrates the baseband filters with the up-conversion mixer of the prior art by using embedded baseband filters so as to reduce the chip area and the current.

To achieve the above objective, the present invention provides a high linearity up-conversion mixer, which includes: a voltage-to-current conversion circuit and an up-conversion mixer core circuit, the voltage-to-current conversion circuit has a differential signal positive input end for receiving an I-channel or a Q-channel positive baseband voltage signal and a differential signal negative input end for receiving an I-channel or a Q-channel negative baseband voltage signal, wherein the received positive baseband voltage signal and the received negative baseband voltage signal are low pass filtered by the voltage-to-current conversion circuit and are converted to a first current signal and a second current signal, the first and second current signals are inputted to the up-conversion mixer core circuit to mix with local oscillator signals so as to output high linearity frequency-mixed signals.

Further, the voltage-to-current conversion circuit includes a first resistor, a first capacitor, a second resistor, a second capacitor, a fourth resistor, a third capacitor, a fifth resistor, a fourth capacitor and an operational amplifier circuit, wherein the first resistor has one end connected to the positive baseband voltage signal and has the other end connected to the first capacitor; the first capacitor has its other end connected to ground; the second resistor has one end connected to the first resistor and the first capacitor and has the other end connected to the second capacitor and an input end of the operational amplifier circuit; the second capacitor has its other end connected to a first output end of the operational amplifier circuit for outputting a first low-pass filtered output voltage; the fourth resistor has one end connected to the negative baseband voltage signal and has the other end connected to the third capacitor; the third capacitor has its other end connected to ground; the fifth resistor has one end connected to the fourth resistor and the third capacitor and has the other end connected to the fourth capacitor and the other input end of the operational amplifier circuit; the fourth capacitor has its other end connected to a second output end of the operational amplifier circuit for outputting a second low-pass filtered output voltage.

Further, the voltage-to-current conversion circuit further includes a third resistor and a sixth resistor, wherein the third resistor has one end connected to a common end of the first resistor, the second resistor and the first capacitor and has the other end connected to the first output end of the operational amplifier circuit; the sixth resistor has one end connected to a common end of the fourth resistor, the fifth resistor and the third capacitor and has the other end connected to the second output end of the operational amplifier circuit.

Further, the operational amplifier circuit includes a first PMOS transistor, a first NMOS transistor, a second PMOS transistor, a second NMOS transistor, a first current source, a third NMOS transistor, a second current source, a fourth NMOS transistor, a third current source, a fifth NMOS transistor, a seventh resistor, a sixth NMOS transistor, an eighth resistor, a third PMOS transistor, a fourth current source, a fourth PMOS transistor and a fifth current source, wherein the first PMOS transistor and the second PMOS transistor both have a source electrode connected to the first current source; the first PMOS transistor has a gate electrode connected to the second resistor and has a drain electrode connected to a drain electrode of the first NMOS transistor; the second PMOS transistor has a gate electrode connected to the fifth transistor and has a drain electrode connected to a drain electrode of the second NMOS transistor; the first NMOS transistor and the second NMOS transistor both have a gate electrode connected to a control voltage and has a source electrode both connected to ground; the third NMOS transistor has a source electrode connected to the drain electrode of the first PMOS transistor and has a drain electrode connected to the second current source; the fourth NMOS transistor has a source electrode connected to the drain electrode of the second PMOS transistor and has a drain electrode connected to the third current source; the fifth NMOS transistor has a gate electrode connected to the drain electrode of the third NMOS transistor, has a source electrode connected to ground via the seventh resistor, and has a drain electrode for outputting the first current signal; the sixth NMOS transistor has a gate electrode connected to the drain electrode of the fourth NMOS transistor, a source electrode connected to ground via the eighth resistor, and a drain electrode for outputting the second current signals; the third PMOS transistor has a gate electrode connected to the source electrode of the fifth NMOS transistor and has a source electrode connected to the fourth current source and outputs the first low-pass filtered output voltage; the fourth PMOS transistor has a gate electrode connected to the source electrode of the sixth NMOS transistor and has a source electrode connected to the fifth current source and outputs the second low-pass filtered output voltage.

Compared with the prior art, the high linearity up-conversion mixer of the present invention integrates the baseband filters with the up-conversion mixer by embedding low-pass filters into the voltage-to-current conversion circuit of the up-conversion mixer, thus ensuring the high linearity of the up-conversion mixer while reducing the chip area and the current.

DETAILED DESCRIPTION

The present invention will be described and specified below in combination with specific exemplary embodiments and accompanying drawings. Other advantages and effects of the present invention will be easily understood by those skilled in this art based on the disclosure in the specification. The present invention may be practiced or carried out by other embodiments, and variations and modifications may be made to details of the specification without departing from the scope of the invention.

Figure 1:
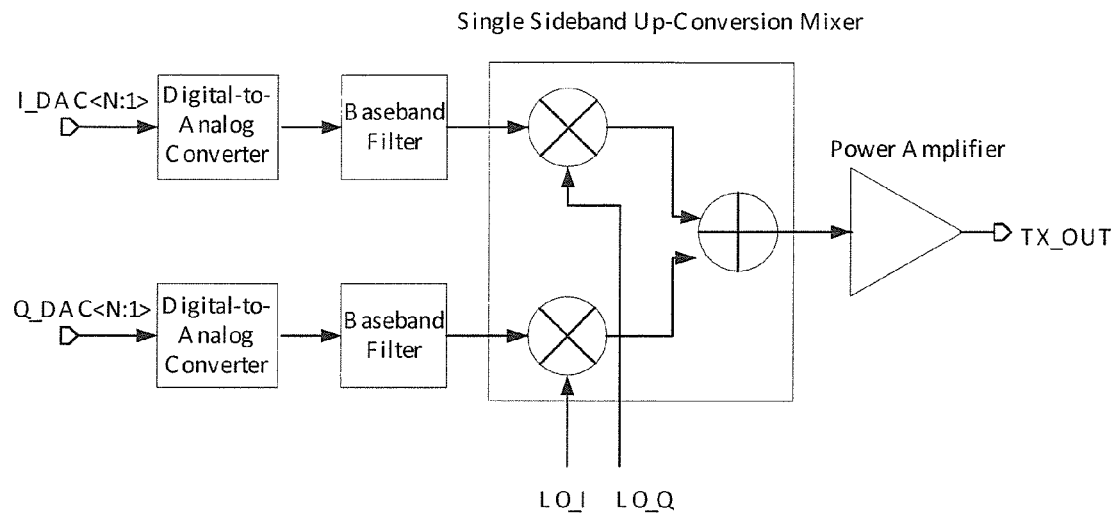
FIG. 1 is a schematic diagram of the structure of a zero IF transmitter in the prior art.
Figure 2:
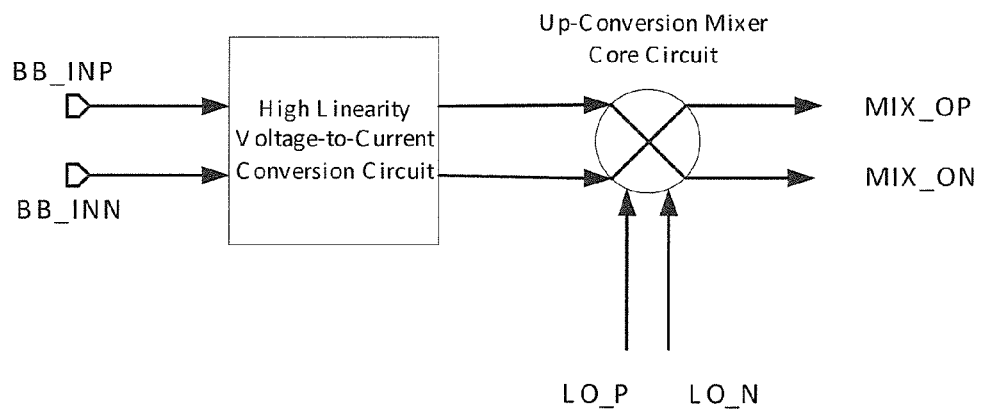
FIG. 2 is a structural diagram of the up-conversion mixer in FIG. 1.
Figure 3:
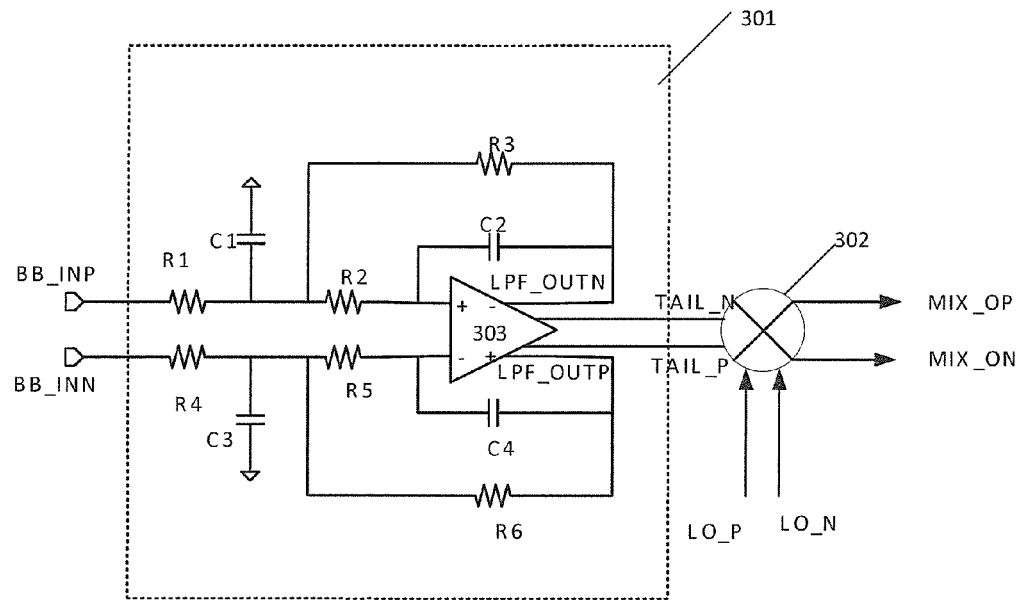
FIG. 3 is a structural diagram of the high linearity up-conversion mixer of a preferable embodiment of the present invention.

FIG. 3 is a structure diagram of the high linearity up-conversion mixer of a preferable embodiment of the present invention. As shown in FIG. 3, the high linearity up-conversion mixer of the present invention used in wireless transmitter circuit at least includes a voltage-to-current conversion circuit 301 and an up-conversion mixer core circuit 302. The voltage-to-current conversion circuit 301 has two input ends, wherein one end is a differential signal positive input end for receiving I-channel or Q-channel positive baseband voltage signal BB_INP, and the other end is a differential signal negative input end for receiving I-channel or Q-channel negative baseband voltage signal BB_INN. The positive baseband voltage signal BB_INP and the negative baseband voltage signal BB_INN are respectively converted to first current signal TAIL_N and second current signal TAIL_P by removing high-frequency signals in BB_INP and BB_INN through the voltage-to-current conversion circuit 301. Then, the first current signal TAIL_N and the second current signal TAIL_P are inputted to the up-conversion mixer core circuit 302 to mix with local oscillator signals (LO_P and LO_N) so as to output high linearity frequency mixed signals (MIX_OP and MIX_ON). It should be noted that, the first current signal TAIL_N and second current signal TAIL_P are substantially differential currents.

In a preferred embodiment, the voltage-to-current conversion circuit 301 at least includes a resistor R1, a capacitor C1, a resistor R2, a capacitor C2, a resistor R4, a capacitor C3, a resistor R5, a capacitor C4 and an operational amplifier circuit 303, wherein the resistor R1 has one end connected to the positive baseband voltage signal BB_INP, and has the other end connected to the capacitor C1 which has its other end connected to ground; the resistor R2 has one end connected to the resistor R1 and the capacitor C1, and has the other end connected to the capacitor C2 which has its other end connected to a first output end of the operational amplifier circuit 303 (LPF_OUTN) for outputting a first low-pass filtered output voltage; the resistor R4 has one end connected to the negative baseband voltage signal BB_INN and has the other end connected to the capacitor C3 which has its other end connected to ground; the resistor R5 has one end connected to the resistor R4 and the capacitor C3, and has the other end connected to the capacitor C4 which has its other end connected to a second output end of the operational amplifier circuit 303 (LPF_OUTP) for outputting a second low-pass filtered output voltage. In this way, the voltage-to-current conversion circuit 301 of the present invention can form an active low-pass filter to improve the gain. It should be noted that although the preferred embodiment adopts a second-order RC low-pass filter, it is not limited thereto. The present invention can be conveniently expanded to higher-order low-pass filters by those skilled in the art.

In a preferred embodiment, the voltage-to-current conversion circuit 301 may further include a resistor R3 and a resistor R6, wherein the resistor R3 has one end connected to a common end of the resistor R1, the resistor R2 and the capacitor C1, and has the other end connected to the first output end of the operational amplifier circuit 303; the resistor R6 has one end connected to a common end of the resistor R4, the resistor R5 and the capacitor C3, and has the other end connected to the second output end of the operational amplifier circuit 303; preferably, R1=R4; R2=R5; R3=R6; C1=C3; C2=C4.

Figure 4:
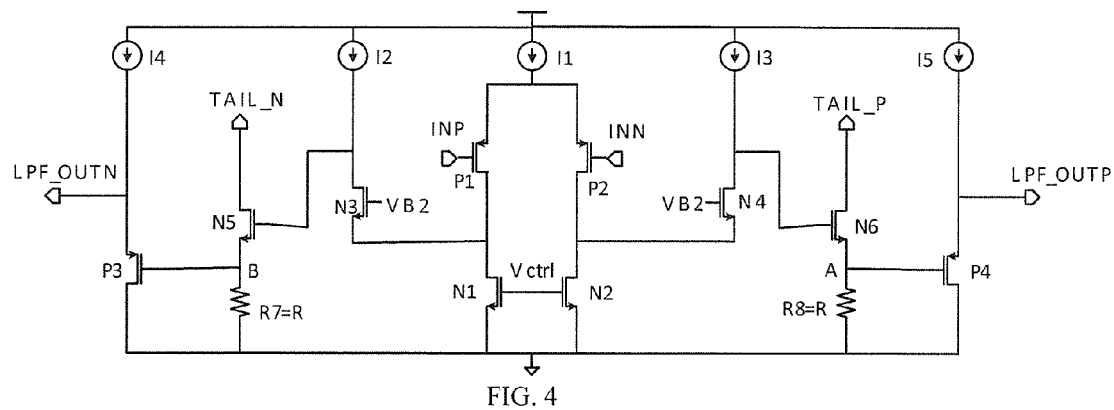
FIG. 4 is a detailed circuit diagram of the operational amplifier circuit in a preferred embodiment of the present invention.

FIG. 4 is a detailed circuit diagram of the operational amplifier circuit 303 in a preferred embodiment of the present invention. As shown in FIG. 4, the operational amplifier circuit 303 includes a first PMOS transistor P1, a first NMOS transistor N1, a second PMOS transistor P2, a second NMOS transistor N2, a first current source I1, a third NMOS transistor N3, a second current source I2, a fourth NMOS transistor N4, a third current source I3, a fifth NMOS transistor N5, a resistor R7, a sixth NMOS transistor N6, a resistor R8, a third PMOS transistor P3, a fourth current source I4, a fourth PMOS transistor P4 and a fifth current source I5. The first PMOS transistor P1 and the second PMOS transistor P2 form a common source amplifier. The first PMOS transistor P1 has a source electrode connected to the first current source I1, a gate electrode connected to the resistor R2 to obtain the positive voltage signal INP, and a drain electrode connected to a drain electrode of the first NMOS transistor N1. The second PMOS transistor P2 has a source electrode also connected to the first current source I1, a gate electrode connected to the resistor R5 to obtain the negative voltage signal INN, and a drain electrode connected to a drain electrode of the second NMOS transistor N2. The first NMOS transistor N1 and the second NMOS transistor N2 both have their gate electrodes connected to a control voltage Vctrl and both have their source electrodes connected to ground. The third NMOS transistor N3 and the fourth NMOS transistor N4 both have their gate electrodes connected to ground or VB2 to form a common gate amplifier. The third NMOS transistor N3 has a source electrode connected to the drain electrode of the first PMOS transistor P1, a drain electrode connected to the second current source I2, and a gate electrode connected to ground or VB2. The fourth NMOS transistor N4 has a source electrode connected to the drain electrode of the second PMOS transistor P2, a drain electrode connected to the third current source I3, and a gate electrode connected to ground or VB2. The fifth NMOS transistor N5 and the six NMOS transistor N6 form a source follower. The fifth NMOS transistor N5 has a gate electrode connected to the drain electrode of the third NMOS transistor N3, a source electrode connected to ground via the resistor R7, and a drain electrode which outputs the first current signal TAIL_N. The sixth NMOS transistor N6 has a gate electrode connected to the drain electrode of the fourth NMOS transistor N4, a source electrode connected to ground via the resistor R8, and a drain electrode which outputs the second current signal TAIL_P. The third PMOS transistor P3 and the fourth PMOS transistor P4 form another source follower. The third PMOS transistor P3 has a gate electrode connected to the source electrode of the fifth NMOS transistor N5, and a source electrode connected to the fourth current source I4 and outputs the first low-pass filtered output voltage LPF_OUTN. The fourth PMOS transistor P4 has a gate electrode connected to the source electrode of the sixth NMOS transistor N6, and a source electrode connected to the fifth current source I5 and outputs the second low-pass filtered output voltage LPF_OUTP.

The operation principle of the present invention will be described below in combination with FIG. 3 and FIG. 4. I-channel or Q-channel baseband voltage signals (BB_INP and BB_INN) are inputted to the voltage-to-current conversion circuit 301 as shown in FIG. 3. The overall function of the voltage-to-current conversion circuit 301 is to filter the inputted baseband voltage signals (BB_INP and BB_INN) and to linearly convert the filtered voltage signals to the first current signal TAIL_N and the second current signal TAIL_P and to output the signals TAIL_N and TAIL_P. As the voltage-to-current conversion circuit 301 has a function of a second-order low-pass filter, the first low-pass filtered output voltage LPF_OUTN and the second low-pass filtered output voltage LPF_OUTP are voltage signals outputted by passing the inputted baseband voltage signals through a low-pass filter. Accordingly, voltage V(A) at the point A and voltage V(B) at the point B in FIG. 4 can be expressed by the following equations:

$$V(A)=V(LPF\_OUTP)-Vgs(P4);\text{ and}$$

$$V(B)=V(LPF\_OUTN)-Vgs(P3),\text{ respectively.}$$

Thus, currents outputted by the first current signal TAIL_N and the second current signal TAIL_P can be expressed by the following equations:

$$I(TAIL\_N)=V(A)/R=\{V(LPF\_OUTN)-Vgs(P3)\}/R,$$
and $$I(TAIL\_P)=V(A)/R=\{V(LPF\_OUTP)-Vgs(P4)\}/R,$$
respectively, where, Vgs(P4)=Vgs(P3). From the above derivation, it can be found that the first current signal TAIL_N and the second current signal TAIL_P are obtained by linearly converting the first low-pass filtered output voltage LPF_OUTN and the second low-pass filtered output voltage LPF_OUTP, respectively. The first current signal TAIL_N and the second current signal TAIL_P are further inputted to the up-conversion mixer core circuit 302 to mix with local oscillator signals so as to output differential signals of the up-conversion mixer MIX_OP and MIX_ON.

It should be noted that the preferred embodiments of the present invention is based on a differential method and the CMOS process, but is not limited thereto. Its principle can be applied to other processes, such as bipolar process or BiCMOS process, and single-ended modes.

According to the above description, the high linearity up-conversion mixer of present invention integrates baseband filters with the up-conversion mixer of the transmitter through embedding the low-pass filter into the voltage-to-current conversion circuit of the up-conversion mixer so as to ensure the high linearity of the up-conversion mixer while reduce chip area and the amount of current.

Numerous embodiments with great variations can be made without departing from the spirit and scope of the invention. It will be understood that specific embodiments described in the specification shall not be intended to limit the scope of the invention which shall solely be limited by the appended claims.

What is claimed is:

1. A high linearity up conversion mixer comprising a voltage-to-current conversion circuit and an up-conversion mixer core circuit, the voltage-to-current conversion circuit comprising a first resistor, a first capacitor, a second resistor, a second capacitor, a fourth resistor, a third capacitor, a fifth resistor, a fourth capacitor and an operational amplifier circuit, the first resistor having one end serving as a differential signal positive input end for receiving an I-channel or a Q-channel positive baseband voltage signal and having the other end connected to the first capacitor, the first capacitor having its other end connected to ground, the second resistor having one end connected to the first resistor and the first capacitor and having the other end connected to the second capacitor and a first input end of the operational amplifier circuit, the second capacitor having its other end connected to a first output end of the operational amplifier circuit for outputting a first low-pass filtered output voltage, the fourth resistor having one end serving as a differential signal negative input end for receiving an I-channel or a Q-channel negative baseband voltage signal and having the other end connected to the third capacitor, the third capacitor having its other end connected to ground, the fifth resistor having one end connected to the fourth resistor and the third capacitor and having the other end connected to the fourth capacitor and a second input end of the operational amplifier circuit, the fourth capacitor having its other end connected to a second output end of the operational amplifier circuit for outputting a second low-pass filtered output voltage, wherein the received positive baseband voltage signal and the received negative baseband voltage signal are low pass filtered by the voltage-to-current conversion circuit and are converted to a first current signal and a second current signal, the first and second current signals being inputted to the up-conversion mixer core circuit to mix with local oscillator signals so as to output high linearity frequency-mixed signals.

2. The high linearity up-conversion mixer according to claim 1, wherein the voltage-to-current conversion circuit further comprises a third resistor and a sixth resistor, the third resistor having one end connected to a common end of the first resistor, the second resistor and the first capacitor and having the other end connected to the first output end of the operational amplifier circuit, the sixth resistor having one end connected to a common end of the fourth resistor, the fifth resistor and the third capacitor and having the other end connected to the second output end of the operational amplifier circuit.

3. The high linearity up-conversion mixer according to claim 2, wherein the operational amplifier circuit comprises a first PMOS transistor, a first NMOS transistor, a second PMOS transistor, a second NMOS transistor, a first current source, a third NMOS transistor, a second current source, a fourth NMOS transistor, a third current source, a fifth NMOS transistor, a seventh resistor, a sixth NMOS transistor, an eighth resistor, a third PMOS transistor, a fourth current source, a fourth PMOS transistor and a fifth current source, the first PMOS transistor and the second PMOS transistor both having a source electrode connected to the first current source, the first PMOS transistor having a gate electrode connected to the second resistor and having a drain electrode connected to a drain electrode of the first NMOS transistor, the second PMOS transistor having a gate electrode connected to the fifth transistor and having a drain electrode connected to a drain electrode of the second NMOS transistor, the first NMOS transistor and the second NMOS transistor both having a gate electrode connected to a control voltage and both having a source electrode connected to ground, the third NMOS transistor having a source electrode connected to the drain electrode of the first PMOS transistor and having a drain electrode connected to the second current source, the fourth NMOS transistor having a source electrode connected to the drain electrode of the second PMOS transistor and having a drain electrode connected to the third current source, the fifth NMOS transistor having a gate electrode connected to the drain electrode of the third NMOS transistor, a source electrode connected to ground via the seventh resistor, and a drain electrode for outputting the first current signal; the sixth NMOS transistor having a gate electrode connected to the drain electrode of the fourth NMOS transistor, a source electrode connected to ground via the eighth resistor, and a drain electrode for outputting the second current signal, the third PMOS transistor having a gate electrode connected to the source electrode of the fifth NMOS transistor and having a source rode connected to the fourth current source and outputting the first low pass filtered output voltage, the fourth PMOS transistor having a gate electrode connected to the source electrode of the sixth NMOS transistor and having a source electrode connected to the fifth current source and outputting the second low pass filtered output voltage.

* * * * *

UNITED STATES PATENT AND TRADEMARK OFFICE
CERTIFICATE OF CORRECTION

PATENT NO.       : 8,482,335 B2
APPLICATION NO.  : 13/595778
DATED            : July 9, 2013
INVENTOR(S)      : Dedong Ze Page 1 of 1

It is certified that error appears in the above-identified patent and that said Letters Patent is hereby corrected as shown below:

In the Claims,

Column 8, Claim 3, line 19, please delete "rode" and insert --electrode--.

Column 8, Claim 3, line 20, please delete "low pass" and insert --low-pass--.

Column 8, Claim 3, line 25, please delete "low pass" and insert --low-pass--.

Signed and Sealed this
Eighth Day of October, 2013

Teresa Stanek Rea
*Deputy Director of the United States Patent and Trademark Office*